(12) United States Patent
Embertson et al.

(10) Patent No.: US 10,707,113 B2
(45) Date of Patent: Jul. 7, 2020

(54) END EFFECTOR ASSEMBLY FOR CLEAN/DIRTY SUBSTRATE HANDLING

(71) Applicant: Lam Research Corporation, Fremont, CA (US)

(72) Inventors: Ross Embertson, Half Mood Bay, CA (US); Brandon Senn, Molalla, OR (US); Austin Ngo, San Jose, CA (US); Matthew J. Rodnick, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 102 days.

(21) Appl. No.: 15/689,330

(22) Filed: Aug. 29, 2017

(65) Prior Publication Data

US 2018/0005865 A1    Jan. 4, 2018

Related U.S. Application Data

(62) Division of application No. 14/687,506, filed on Apr. 15, 2015, now Pat. No. 9,779,977.

(51) Int. Cl.
*H01L 21/687* (2006.01)
*H01L 21/677* (2006.01)

(52) U.S. Cl.
CPC .. *H01L 21/68707* (2013.01); *H01L 21/67742* (2013.01); *H01L 21/68785* (2013.01)

(58) Field of Classification Search
CPC ..... B25J 9/04; B25J 9/041; B25J 9/042; B25J 9/043; B25J 9/044; B25J 9/045; B25J 11/0095; B25J 15/0052; B25J 15/0061; H01L 21/68707; H01L 21/6875

USPC .......... 414/222.01, 806, 941; 901/30, 31, 39
See application file for complete search history.

(56) References Cited

U.S. PATENT DOCUMENTS

| | | |
|---|---|---|
| 5,700,046 A | 12/1997 | Van Doren et al. |
| 5,711,646 A | 1/1998 | Ueda et al. |
| 6,540,468 B1 | 4/2003 | Blattner et al. |
| 2008/0267747 A1 | 10/2008 | DiBella et al. |
| 2010/0243168 A1* | 9/2010 | Nakano ............ H01L 21/67742 156/345.54 |
| 2011/0236162 A1 | 9/2011 | Shikayama et al. |
| 2012/0189408 A1 | 7/2012 | Bonora |
| 2012/0224945 A1 | 9/2012 | Douki et al. |

(Continued)

FOREIGN PATENT DOCUMENTS

JP    4976811 B2    7/2012

*Primary Examiner* — Saul Rodriguez
*Assistant Examiner* — Brendan P Tighe

(57) ABSTRACT

An end effector includes a body, a first tine, and a second tine. The body includes first, second, and third substrate support pads, the first substrate support pad defines a first height, the second substrate support pad defines a second height less than the first height, and the third substrate support pad defines a third height equal to the first height. The first tine includes fourth and fifth substrate support pads, the fourth substrate support pad defines a fourth height equal to the second height, and the fifth substrate support pad defines a fifth height equal to the first and third heights. The second tine includes sixth and seventh substrate support pads, the sixth substrate support pad defines a sixth height equal to the first, third, and fifth heights, the seventh substrate support pad defines a seventh height equal to the second and fourth heights.

7 Claims, 6 Drawing Sheets

(56) References Cited

U.S. PATENT DOCUMENTS

2014/0056679 A1    2/2014   Yamabe et al.
2016/0155658 A1    6/2016   Yang

\* cited by examiner

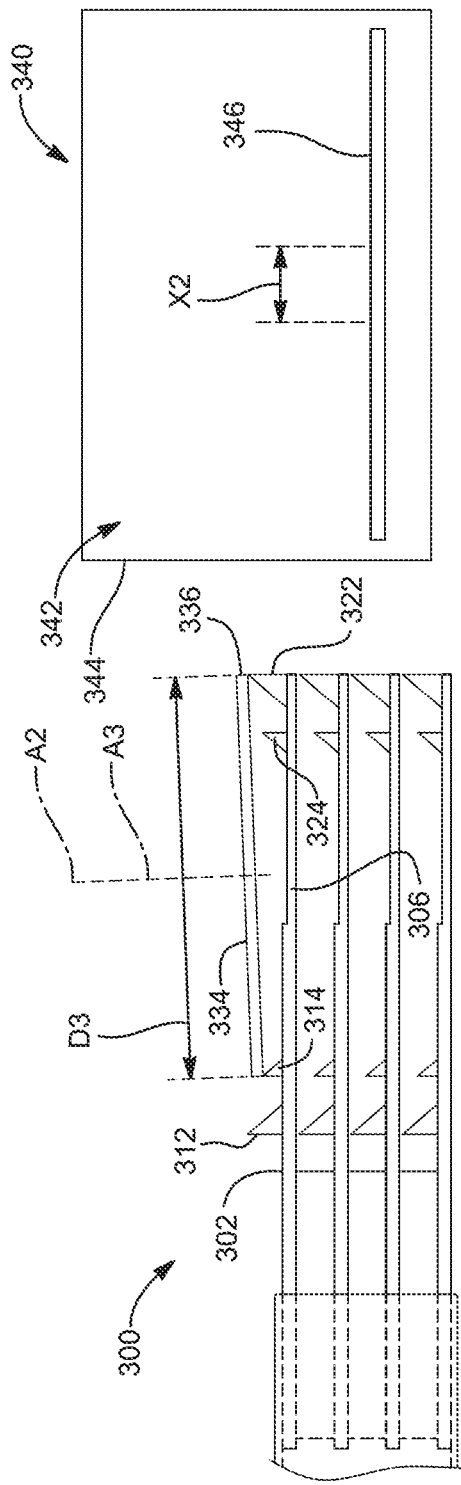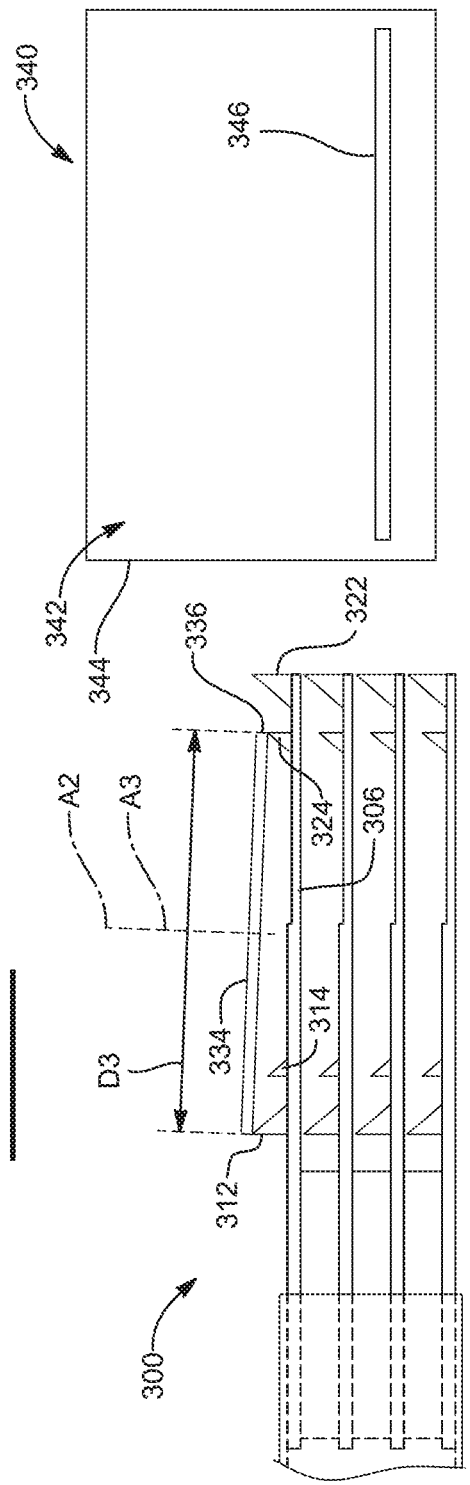

END EFFECTOR ASSEMBLY FOR CLEAN/DIRTY SUBSTRATE HANDLING

CROSS-REFERENCE TO RELATED APPLICATIONS

The present disclosure is a divisional of U.S. patent application Ser. No. 14/687,506 filed on Apr. 15, 2015. The entire disclosure of the application referenced above is incorporated herein by reference.

FIELD

The present disclosure relates to substrate handling systems, and more particularly to a device and method for handling substrates in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching and/or other processing of substrates such as semiconductor wafers. When processing substrates, a robot with an end effector may be used to place an unprocessed or clean substrate on a pedestal in a processing chamber of the substrate processing system. During processing, a gas mixture is introduced into the processing chamber and plasma is struck to deposit, etch and/or otherwise treat the substrate. After the substrate has been treated, the end effector may be used to remove the treated or dirty substrate from the processing chamber.

SUMMARY

In one aspect, the present disclosure provides a method of handling a substrate with an end effector in a substrate processing system. The end effector includes first, second, third, fourth, fifth, sixth, and seventh substrate support pads. The method includes engaging a peripheral edge of the substrate with the second, fifth, and sixth substrate support pads. The method also includes moving the end effector a first distance into a processing chamber of the substrate processing system. The method further includes disengaging the peripheral edge of the substrate from the second, fifth, and sixth substrate support pads. The method additionally includes moving the end effector a second distance into the processing chamber of the substrate processing system, and engaging the peripheral edge of the substrate with the first, third, fourth, and seventh substrate support pads.

In some configurations, the first and third substrate support pads define a first height, and the fourth and sixth substrate support pads define a second height that is less than the first height.

In some configurations, the second substrate support pad defines a first height, and the fifth and sixth substrate support pads define a second height that is greater than the first height.

In some configurations, the first and third substrate support pads define a third height that is equal to the second height, and the fourth and sixth substrate support pads define a fourth height that is equal to the first height.

In some configurations, engaging a peripheral edge of the substrate with the second, fifth, and sixth substrate support pads includes positioning the fourth and seventh substrate support pads radially inward of the peripheral edge of the substrate.

In some configurations, engaging the peripheral edge of the substrate with the first, third, fourth, and seventh substrate support pads further includes positioning the second substrate support pad radially inward of the peripheral edge of the substrate.

In some configurations, the second, fifth, and sixth substrate support pads define a first circle having a first diameter and a first central axis.

In some configurations, the first, third, fourth, and seventh substrate support pads define a second circle having a second diameter and a second central axis, and the substrate defines a third circle having a third central axis.

In some configurations, engaging the peripheral edge of the substrate with the second, fifth, and sixth substrate support pads includes disposing the second central axis at a first angle relative to a third central axis.

In some configurations, engaging the peripheral edge of the substrate with the first, third, fourth, and seventh substrate support pads includes disposing the first central axis at a second angle relative to the third central axis.

In some configurations, the first angle is equal to the second angle.

In some configurations, the first diameter is equal to the second diameter.

In some configurations, the first, second, third, fourth, fifth, sixth, and seventh substrate support pads include first, second, third, fourth, fifth, sixth, and seventh inclined substrate support surfaces, respectively.

In another aspect, the present disclosure provides an end effector. The end effector includes a body, a first tine, and a second tine. The body includes first, second, and third substrate support pads. The first substrate support pad defines a first height. The second substrate support pad defines a second height that is less than the first height. The third substrate support pad defines a third height that is equal to the first height. The first tine extends from the body and includes fourth and fifth substrate support pads. The fourth substrate support pad defines a fourth height that is equal to the second height. The fifth substrate support pad defines a fifth height that is equal to the first and third heights. The second tine extends from the body and includes sixth and seventh substrate support pads. The sixth substrate support pad defines a sixth height that is equal to the first, third, and fifth heights. The seventh substrate support pad defines a seventh height that is equal to the second and fourth heights.

In some configurations, the first, third, fourth, and seventh substrate support pads define a first circle having a first diameter and a first central axis, and the second, fifth, and sixth substrate support pads define a second circle having a second diameter and a second central axis.

In some configurations, the first diameter is equal to the second diameter.

In some configurations, the first central axis is linearly offset from the second central axis.

In some configurations, the first and second central axes define an angle.

In some configurations, the body portion is monolithically formed with the first and second tine portions.

In yet another aspect, the present disclosure provides an end effector. The end effector includes first, second, third, fourth, fifth, sixth, and seventh substrate support pads. The first, third, fourth, and seventh substrate support pads define a first circle. The second, fifth, and sixth substrate support pads define a second circle. The first circle includes a first diameter and a first central axis. The second circle includes a second diameter equal to the first diameter and a second central axis offset from the first central axis. The first substrate support pad defines a first height. The second substrate support pad defines a second height that is less than the first height. The third substrate support pad defines a third height that is greater than the second height. The fourth substrate support pad defines a fourth height that is less than the third height. The fifth substrate support pad defines a fifth height that is greater than the fourth height. The sixth substrate support pad defines a sixth height that is greater than the fourth height. The seventh substrate support pad defines a seventh height that is less than the sixth height.

In some configurations, the first and second central axes define an angle.

In some configurations, the end effector includes a body portion and first and second tine portions extending from the body portion. Each of the fourth, fifth, sixth, and seventh substrate support pads may be disposed on one of the first and second tine portions.

In some configurations, the body portion is monolithically formed with the first and second tine portions.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 6A is an environmental view of a load lock and the end effector of FIG. 3 according to the principles of the present disclosure; and FIG. 6B is another environmental view of the load lock and the end effector of FIG. 3 according to the principles of the present disclosure.

In the drawings, reference numbers may be reused to identify similar and/or identical elements.

DETAILED DESCRIPTION

Figure 1:
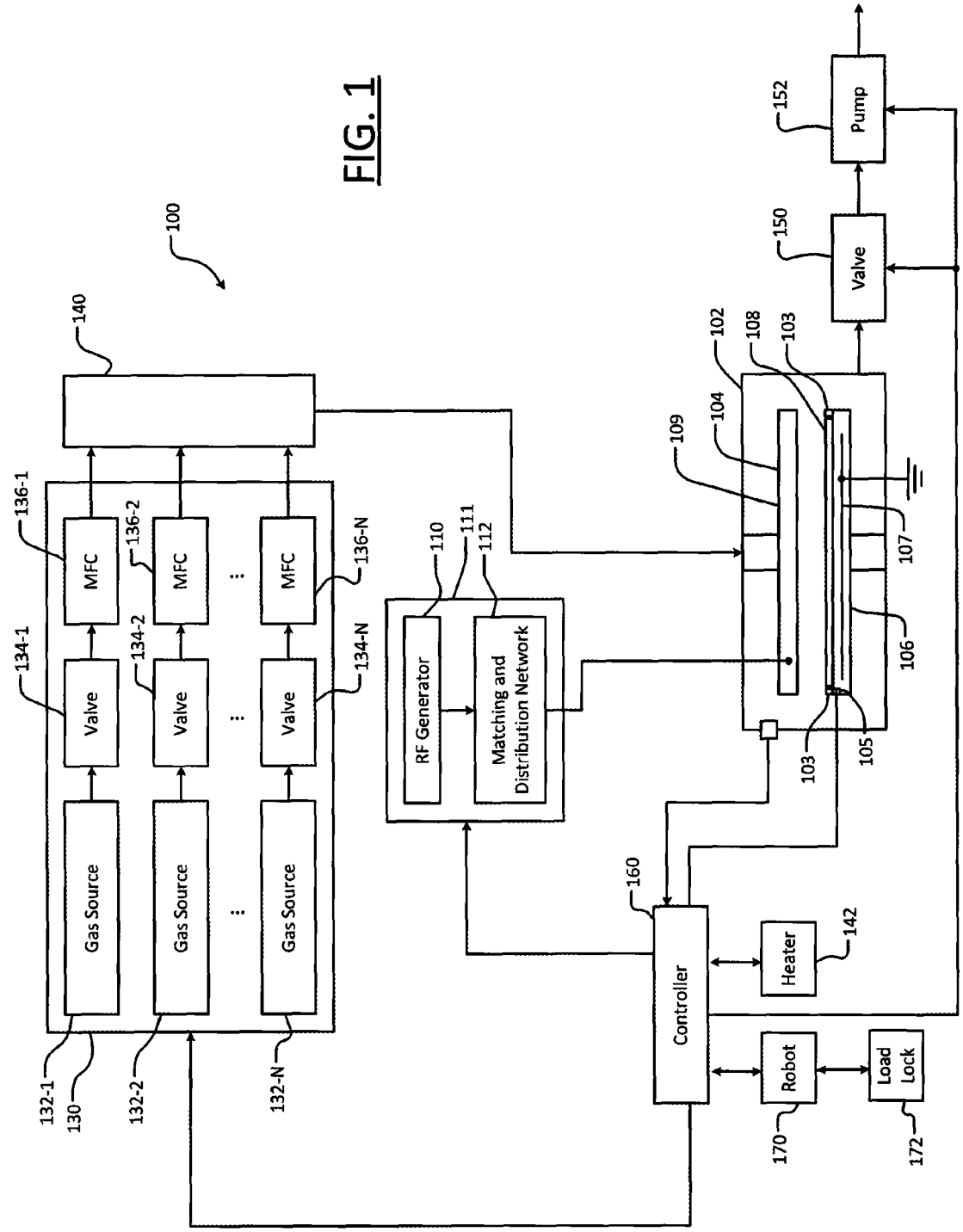
FIG. 1 is a functional block diagram of an example of a substrate processing system according to the principles of the present disclosure.

A substrate, such as a semiconductor wafer, is positioned on a pedestal of a load lock to be transferred into and out of a processing chamber by a substrate handling system. For example, a robot including an end effector may be used to transport the substrate (e.g., an unprocessed or clean substrate having a first temperature) from the load lock to the processing chamber. After the substrate is processed in the processing chamber, the end effector removes and transports the substrate (e.g., a processed or dirty substrate having a second temperature different than the first temperature) from the processing chamber for subsequent use or processing. For example, the end effector may transport the substrate from the processing chamber to the load lock or to another processing chamber.

Heat, particles, and other forms of contamination can have an adverse effect on substrate processing. For example, temperature variations (e.g., localized hotspots) within the substrate can lead to non-uniform processing results, such as non-uniformity of critical device parameters. Temperature variations within the substrate can also adversely affect mass measurements taken of the substrate during processing. In yet another example, transferring particles and other contaminants to the unprocessed substrates can lead to defects in the processed substrates. Accordingly, it is desirable to prevent processed substrates from contaminating unprocessed substrates. In particular, it is often desirable to prevent the transfer of heat, particles, and/or other forms of contamination from the processed substrate to the unprocessed substrate.

Substrate handling systems and methods according to the principles of the present disclosure include a robot with an end effector having a configuration of substrate support pads to engage or support the substrate in at least two discrete positions relative to the end effector. In particular, the substrate handling system includes a first or clean set of stationary substrate support pads and a second or dirty set of stationary substrate supports pads. When the substrate is supported in a first position relative to the end effector, the first set of substrate support pads engage the substrate, and the second set of substrate support pads are disengaged from the substrate. When the substrate is supported in a second position relative to the end effector, the second set of substrate support pads engage the substrate, and the first set of substrate support pads are disengaged from the substrate.

In some configurations, the first set of substrate support pads will only engage the unprocessed substrate, and the second set of substrate support pads will only engage the processed substrate. In other configurations, the second set of substrate support pads will only engage the unprocessed substrate, and the first set of substrate support pads will only engage the processed substrate. Engaging only one of the first and second sets of substrate support pads with the unprocessed substrate, and engaging only the other of the first and second sets of substrate support pads with the processed substrate, prevents the processed substrate from contaminating the unprocessed substrate through either of the first and second sets of substrate support pads. In particular, heat, particles, and other forms of contamination that may be transferred from the processed substrate to the substrate support pads are prevented from being subsequently transferred from the substrate support pads to the unprocessed substrate.

Referring now to FIG. 1, an example of a substrate processing system 100 for performing etching using RF plasma is shown. The substrate processing system 100 includes a processing chamber 102 that encloses other components of the substrate processing chamber 102 and contains the RF plasma. The substrate processing chamber 102 includes an upper electrode 104 and a pedestal 106 including a lower electrode 107. An edge coupling ring 103 is supported by the pedestal 106. One or more actuators 105 may be used to move the edge coupling ring 103. During operation, a substrate 108 is arranged on the pedestal 106 between the upper electrode 104 and the lower electrode 107 and the edge coupling ring 103 is arranged around the substrate 108.

For example only, the upper electrode 104 may include a showerhead 109 that introduces and distributes process gases. The showerhead 109 may include a stem portion including one end connected to a top surface of the processing chamber 102. A base portion is generally cylindrical and extends radially outwardly from an opposite end of the stem portion at a location that is spaced from the top surface of the processing chamber 102. A substrate-facing surface or faceplate of the base portion of the showerhead includes a plurality of holes through which process gas or purge gas flows. Alternately, the upper electrode 104 may include a conducting plate and the process gases may be introduced in another manner. The lower electrode 107 may be arranged in a non-conductive pedestal. Alternately, the pedestal 106 may include an electrostatic chuck that includes a conductive plate that acts as the lower electrode 107.

An RF generating system 110 generates and outputs an RF voltage to one of the upper electrode 104 and the lower electrode 107. The other one of the upper electrode 104 and the lower electrode 107 may be DC grounded, AC grounded or floating. For example only, the RF generating system 110 may include an RF voltage generator 111 that generates the RF voltage that is fed by a matching and distribution network 112 to the upper electrode 104 or the lower electrode 107. In other examples, the plasma may be generated inductively or remotely.

A gas delivery system 130 includes one or more gas sources 132-1, 132-2, . . . , and 132-N (collectively gas sources 132), where N is an integer greater than zero. The gas sources 132 supply one or more gas mixtures. The gas sources 132 may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A heater 142 may be connected to a heater coil (not shown) arranged in the pedestal 106. The heater 142 may be used to control a temperature of the pedestal 106 and the substrate 108. A valve 150 and pump 152 may be used to evacuate reactants from the processing chamber 102. A controller 160 may be used to control components of the substrate processing system 100. The controller 160 may also be used to control the actuator 105 to adjust a position of one or more portions of the edge coupling ring 103.

A robot 170 including an end effector may be used to deliver substrates onto, and remove substrates from, the pedestal 106. For example, the robot 170 may transfer substrates between the pedestal 106 and a load lock 172 according to the principles of the present disclosure.

Figure 2:
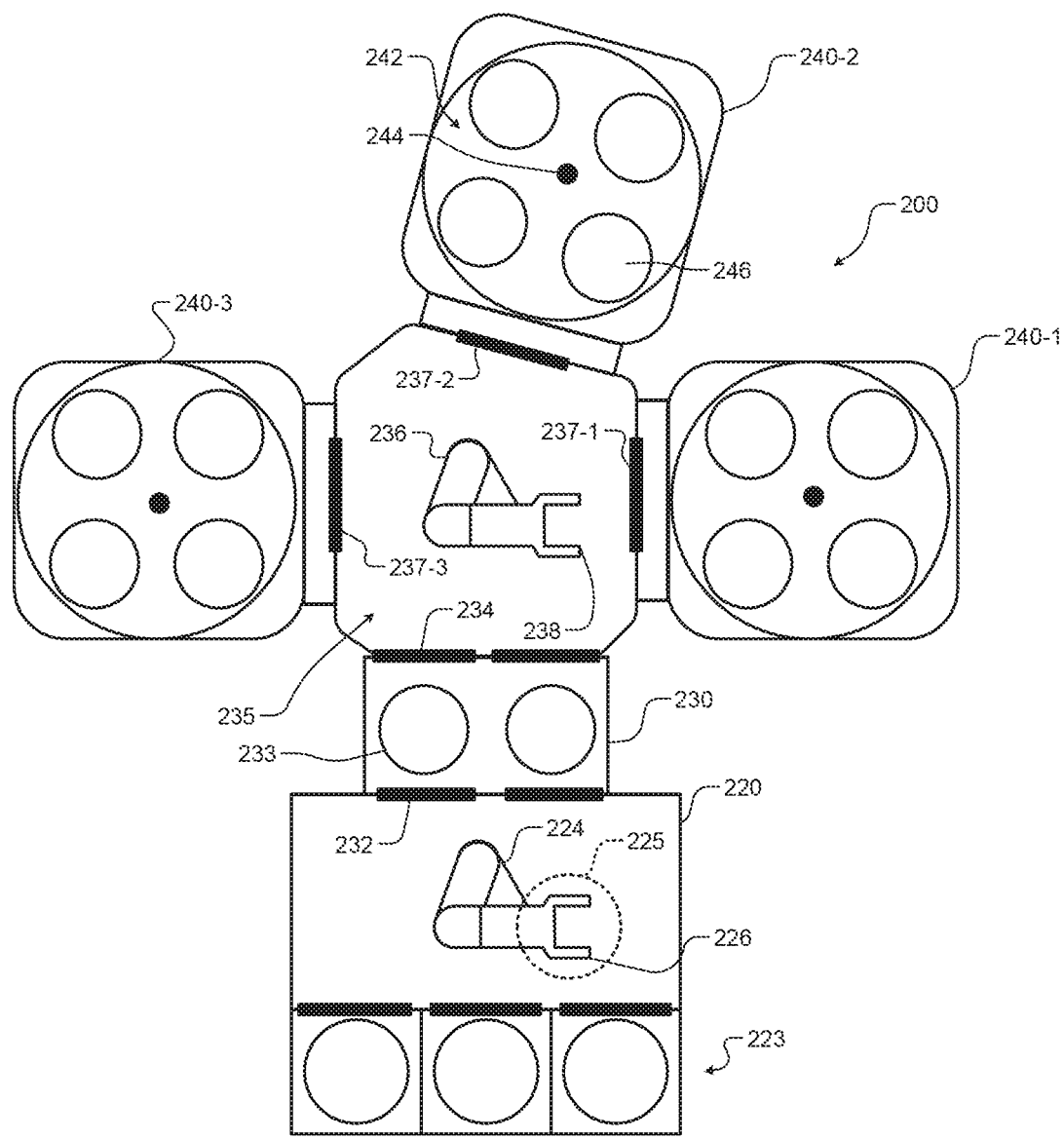
FIG. 2 is a functional block diagram of an example of substrate processing tool according to the principles of the present disclosure.

Referring now to FIG. 2, a non-limiting example substrate processing tool 200 (e.g., as implemented within the substrate processing system 100) includes a transport handling chamber 220 and multiple reactors each with one or more substrate processing chambers. A substrate 225 enters the substrate processing tool 200 from a cassette and/or pod 223, such as a front opening unified pod (FOUP). A robot 224, including one or more end effectors 226, handles the substrate 225. A pressure of the transport handling chamber 220 may be at atmospheric pressure. Alternately, the transport handling chamber 220 may be at vacuum pressure (with ports acting as isolation valves).

The robot 224 moves the substrate 225 from the pod 223 to a load lock 230. For example, the substrate 225 enters the load lock 230 through a port 232 (or isolation valve) and is placed on a load lock pedestal 233. The port 232 to the transport handling chamber 220 closes and the load lock 230 is pumped down to an appropriate pressure for transfer. It will be appreciated that upon entering the load lock 230, the substrate 225 may be in an unprocessed state. For example, upon entering the load lock 230, the substrate 225 may be referred to as an unprocessed or clean substrate and may have a first temperature T1.

The robot 224 transfers the unprocessed substrate 225 from the pod 223 and to the load lock 230 under the guidance of a controller (e.g., the controller 160 as shown in FIG. 1) according to the principles of the present disclosure. For example, the controller 160 can guide the robot 224 and the end effector 226 to remove the substrate 225 from the pod 223 and to place the substrate 225 into the load lock 230. In particular, the controller 160 may guide the robot 224 and/or the end effector 226 into a first position relative to the load lock pedestal 233.

A robot 236, including one or more end effectors 238, in a processing handling chamber 235 moves the substrate from the load lock 230 to a selected reactor 240-1, 240-2, and 240-3 (collectively reactors 240). For example, a port 234 opens and the robot 236 may place the substrates through one of the ports 237-1, 237-2, 237-3 (collectively ports 237) corresponding to the selected reactor 240-1, 240-2, and 240-3. Although the load lock 230 is shown having multiple pedestals 233 and associated ports 232, 234, in some embodiments the load lock 230 may include only a single pedestal 233 and respective ports 232, 234.

The robot 236 transfers the substrates from the load lock 230, and to and from the processing chamber of the reactor 240, under the guidance of the controller (e.g., the controller 160 as shown in FIG. 1) according to the principles of the present disclosure. For example, the controller 160 can guide the robot 236 and the end effector 238 to remove the substrate 225 from the load lock 230 and to place the substrate 225 into the processing chamber of the reactor 240 for processing. In particular, the controller 160 may guide the robot 236 and/or the end effector 238 into a first position relative to the transfer plate 246 of the reactor 240. Prior to entering the processing chamber of the reactor 240, the substrate 225 may be in the unprocessed state. For example, the substrate 225 may have the first temperature T1.

A substrate indexing mechanism 242 may be used to further position the substrates relative to the substrate processing chambers of the reactors 240. In some examples, the indexing mechanism 242 includes a spindle 244 and transfer plates 246.

In some examples, at least one of the processing chambers or stations of the reactors 240 is capable of performing semiconductor processing operations, such as a material deposition or etch, sequentially or simultaneously with the other stations. In some examples, one or more of the stations may perform RF-based semiconductor processing operations.

The substrate is moved from one station to the next in the reactor 240 using the substrate indexing mechanism 242. One or more of the stations of the reactors 240 may be capable of performing RF plasma deposition or etching. During use, the substrates are moved to one or more of the reactors 240, processed and then returned. As can be appreciated, reducing the handling time of each substrate improves productivity and throughput.

After the substrate 225 has been processed in the processing chamber of the reactor 240, the controller 160 can guide the robot 236 and the end effector 238 to remove the substrate 225 from the processing chamber of the reactor 240. In particular, the controller 160 may guide the robot 236 and/or the end effector 238 into a second position, different than the first position, relative to the transfer plate 246 of the reactor 240. It will be appreciated that upon removal from the processing chamber of the reactor 240, the substrate 225 may be in a processed state. For example, upon removal from the processing chamber of the reactor 240, the substrate 225 may be referred to as a processed or dirty substrate and may have a second temperature T2 that is different than the first temperature T1. In particular, the second temperature T2 of the substrate 225 in the processed state maybe greater than the first temperature T1 of the substrate 225 in the unprocessed state.

The controller 160 can guide the robot 236 and the end effector 238 to place the processed substrate 225 into the load lock 230. For example, the processed substrate 225 enters the load lock 230 through the port 234 and is placed on the load lock pedestal 233. The robot 236 transfers the substrate to the load lock 230 under the guidance of the controller according to the principles of the present disclosure.

The robot 224, including the end effector 226, moves the processed substrate 225 from the load lock 230 to the pod 223 through one of the ports 232. For example, the controller 160 can guide the robot 224 and the end effector 226 to remove the substrate 225 from the load lock 230 and to place the substrate 225 into the pod 223. In particular, the controller 160 may guide the robot 224 and/or the end effector 226 into a second position relative to the load lock pedestal 233.

Figure 3:
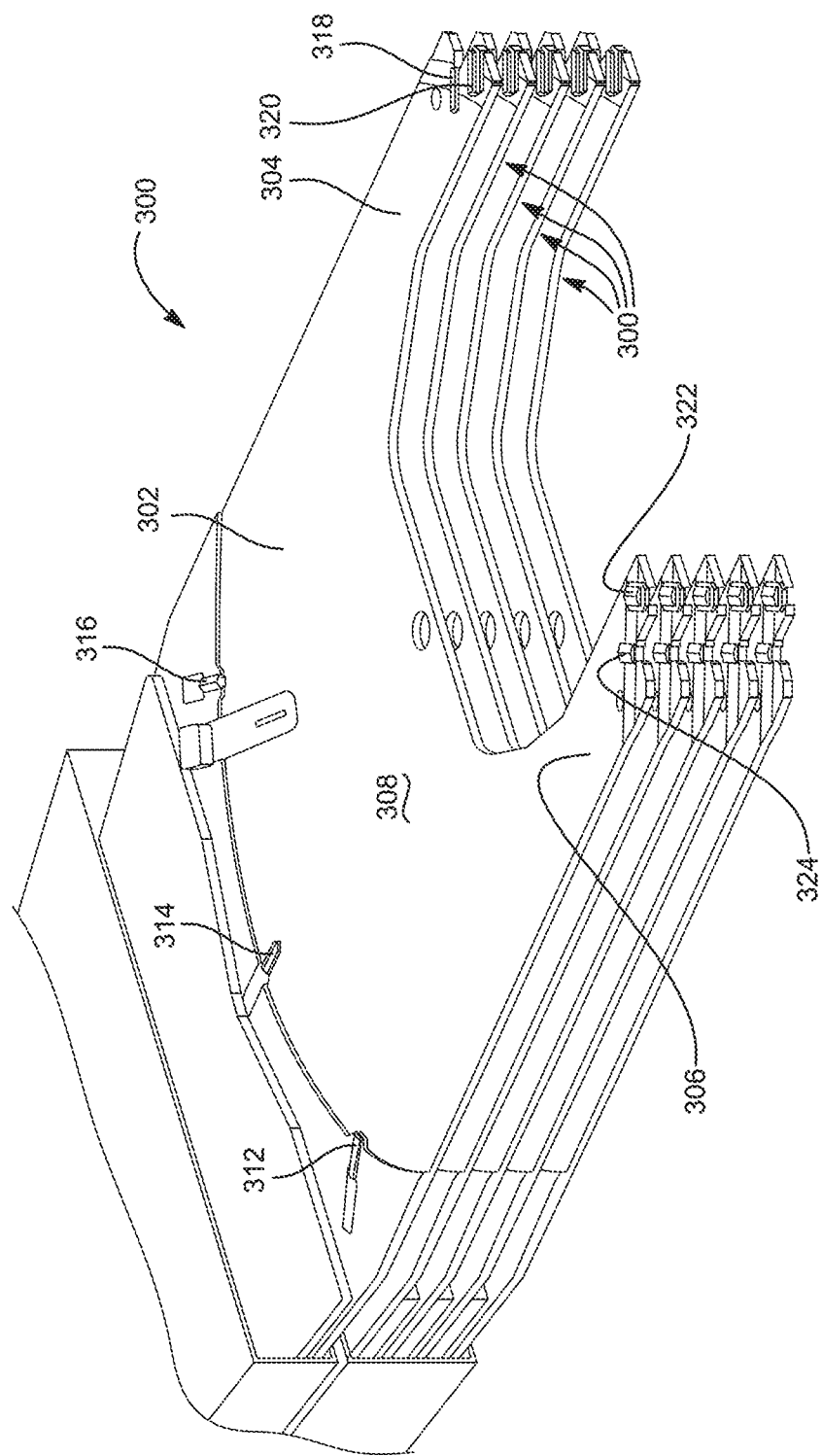
FIG. 3 is a perspective view of an example of an end effector according to the principles of the present disclosure.
Figure 4:
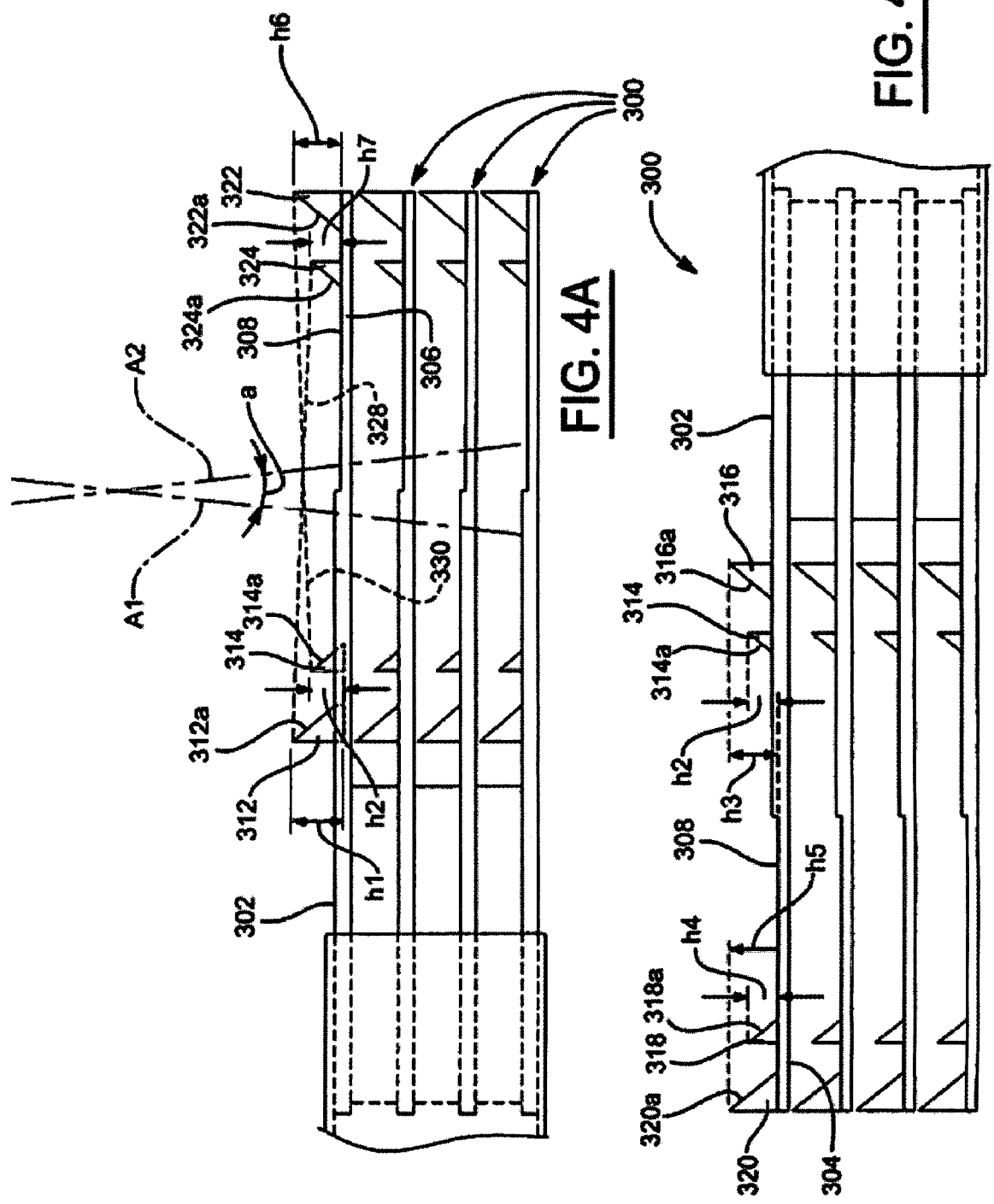
FIG. 4A is a first lateral side view of the end effector of FIG. 3 according to the principles of the present disclosure.
FIG. 4B is a second lateral side view of the end effector of FIG. 3 according to the principles of the present disclosure.
Figure 5:
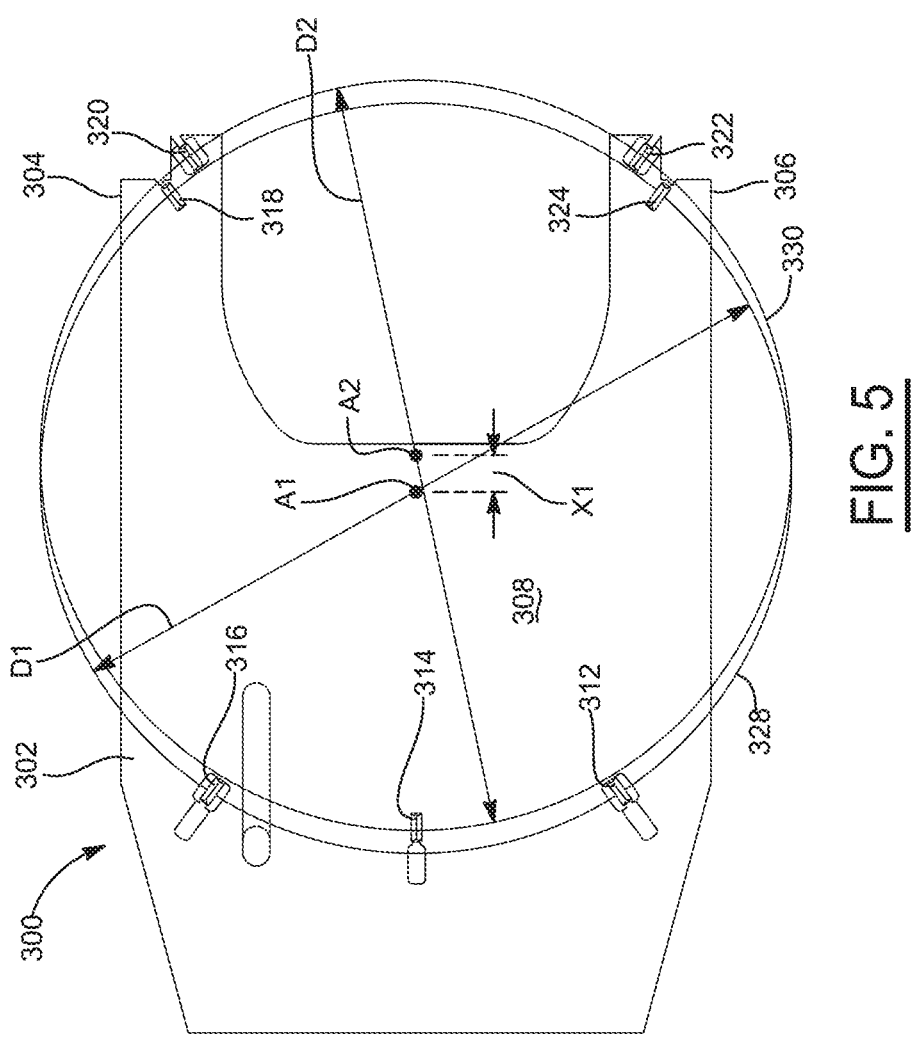
FIG. 5 is a top side view of the end effector of FIG. 3 according to the principles of the present disclosure.

Referring now to FIGS. 3-5, an example robot (e.g., the robot 224 and/or the robot 236 shown in FIG. 2) having an end effector 300 according to the principles of the present disclosure is shown. As illustrated, in some configurations, the robot includes more than one end effector 300. In particular, the robot may include a plurality of stacked end effectors 300. The end effector 300 includes a body portion 302 and first and second tine portions 304, 306. The first and second tine portions 304, 306 extend from body portion 302 such that the end effector 300 defines a generally forked shape or configuration having a substrate-facing surface 308. As illustrated, in some configurations the body portion 302 is integrally or monolithically formed with the first and/or second tine portions 304, 306. It will be appreciated, however, that the body portion 302 and the first and/or second tine portions 304, 306 may be separate and distinct members within the scope of the present disclosure.

The end effector 300 further includes first, second, third, fourth, fifth, sixth, and seventh substrate support pads 312, 314, 316, 318, 320, 322, 324. In some configurations the first, second, and third substrate support pads 312, 314, 316 are disposed on the body portion 302, the fourth and fifth substrate support pads 318, 320 are disposed on the first tine portion 304, and the sixth and seventh substrate support pads 322, 324 are disposed on the second tine portion 306. In this regard, the first, second, third, fourth, fifth, sixth, and seventh substrate support pads 312, 314, 316, 318, 320, 322, 324 may be stationary relative to the body portion 302 and the first and second tine portions 304, 306 of the end effector 300.

As illustrated in FIGS. 4A and 4B, the first, second, third, fourth, fifth, sixth, and/or seventh substrate support pads 312, 314, 316, 318, 320, 322, 324 may be inclined relative to one another and/or relative to the substrate-facing surface 308 of the end effector 300. In particular, the first, second, third, fourth, fifth, sixth, and/or seventh substrate support pads 312, 314, 316, 318, 320, 322, 324 may include first, second, third, fourth, fifth, sixth, and/or seventh inclined surfaces 312a, 314a, 316a, 318a, 320a, 322a, 324a, respectively, that are inclined toward the substrate-facing surface 308 of the end effector 300 in a radially inward direction.

The first, second, third, fourth, fifth, sixth, and seventh substrate support pads 312, 314, 316, 318, 320, 322, 324 define first, second, third, fourth, fifth, sixth, and seventh heights h1, h2, h3, h4, h5, h6, h7, respectively, relative to the substrate-facing surface 308 of the end effector 300. In particular, the inclined surfaces 312a, 314a, 316a, 318a, 320a, 322a, 324a may define the first, second, third, fourth, fifth, sixth, and seventh heights h1, h2, h3, h4, h5, h6, h7. As will be explained in more detail below, the first, second, third, fourth, fifth, sixth, and seventh heights h1, h2, h3, h4, h5, h6, h7 may define a location at which the first, second, third, fourth, fifth, sixth, and seventh substrate support pads 312, 314, 316, 318, 320, 322, 324 engage or otherwise support a substrate 334 (FIGS. 6A and 6B), such as a semiconductor wafer.

The first and third heights h1, h3 are greater than the second height h2. In this regard, the first and third heights h1, h3 may be equal to one another. The fifth height h5 is greater than the fourth height h4, and the sixth height h6 is greater than the seventh height h7. In this regard, the fifth height h5 may be equal to the sixth height h6, and the fourth height h4 may be equal to the seventh height h7. In some configurations, the first, third, fifth, and sixth heights h1, h3, h5, h6 are equal to one another, and the second, fourth, and seventh heights h2, h4, h7 are equal to one another. In particular, the first, third, fifth, and sixth heights h1, h3, h5, h6 may be between 1.1 and 2.1 millimeters greater than the second, fourth, and seventh heights h2, h4, h7. In some configurations, the first, third, fifth, and sixth heights h1, h3, h5, h6 are 1.5 millimeters greater than the second, fourth, and seventh heights h2, h4, h7.

With reference to FIG. 5, the first, third, fourth, and seventh substrate support pads 312, 316, 318, 324 define a first circle 328 having a first diameter D1 and a first central axis A1. The second, fifth, and sixth substrate support pads 314, 320, 322 define a second circle 330 having a second diameter D2 and a second central axis A2. Accordingly, as illustrated in FIG. 5, the third substrate support pad 316 is located between the first and fourth substrate support pads 312, 318 relative to the first circle 328, the fourth substrate support pad 318 is located between the third and seventh substrate support pads 316, 324 relative to the first circle 328, and the seventh substrate support pad 324 is located between the first and fourth substrate support pads 312, 318 relative to the first circle 328. Similarly, the second substrate support pad 314 is located between the fifth and sixth substrate support pads 320, 322 relative to the second circle 330, and the fifth substrate support pad 320 is located between the second and sixth substrate support pads 314, 322 relative to the second circle 330.

The first diameter D1 is equal to the second diameter D2, and the first axis A1 is offset relative to the second axis A2. In particular, the first axis A1 is linearly offset relative to the second axis A2 by a distance X1 (FIG. 5), and the first axis A1 is angularly offset or rotated by an angle α relative to the second axis A2 (FIG. 4A). The distance X1 may be between 5 millimeters and 15 millimeters. In some configurations, the distance X1 is equal to 10 millimeters.

The first and second diameters D1, D2 may further equal a third diameter D3 of the substrate 334 (FIGS. 6A and 6B). Accordingly, as will be explained in more detail below, when the substrate 334 is in a first position, the first, third, fourth, and seventh substrate support pads 312, 316, 318, 324 may engage a peripheral edge 336 of the substrate 334, and when the substrate is in a second position, the second, fifth, and sixth substrate support pads 314,320,322 may engage the peripheral edge 336 of the substrate 334.

Referring now to FIGS. 6A-6B, an example method of handling the substrate 334 with the end effector 300 in a substrate processing system 340 will be described according to the principles of the present disclosure. The method is implemented using various components of FIGS. 1-6B, as described below.

With reference to FIG. 6A, a first mode of operation will be described relative to moving the substrate 334 in an unprocessed state. In particular, the first mode of operation will be described relative to moving the substrate 334 from a load lock (e.g., the load lock 230 of FIG. 2) to a processing chamber 342 of a reactor 344 with a robot (e.g., the robot 236 of FIG. 2) having the end effector 300. It will be appreciated, however, that the first mode of operation may also include moving the substrate 334 from a pod (e.g., the pod 223 of FIG. 2) to the load lock with a robot (e.g., the robot 224 of FIG. 2) having the end effector 300.

In the first mode of operation, the second, fifth, and sixth substrate support pads 314, 320, 322, at the second, fifth, and sixth heights h2, h5, h6, respectively, may engage the peripheral edge 336 of the substrate 334 to remove the substrate 334 from the load lock and move the substrate 334 into the processing chamber 342. Accordingly, when the second, fifth, and sixth substrate support pads 314, 320, 322 engage the peripheral edge 336 of the substrate 334, the fourth and seventh substrate support pads 318, 324 are disposed directly between the substrate 334 and the substrate-facing surface 308 of the end effector 300. In particular, the fourth and seventh substrate support pads 318,324 are disposed radially inward of the peripheral edge 336, and the first and third substrate support pads 312, 316 are disposed radially outward of the peripheral edge 336. In addition, a central axis A3 of the substrate 334 is aligned with the second axis A2 of the second circle 330 as the substrate 334 is moved into processing chamber 342. It will be appreciated that the substrate 334 may be dean or otherwise in an unprocessed condition prior to entering the processing chamber 342, and while being engaged by the second, fifth, and sixth substrate support pads 314, 320, 322.

In order to place the substrate 334 in the processing chamber 342, a controller (e.g., the controller 160 as shown in FIG. 1) may guide a robot (e.g., the robot 236 as shown in FIG. 2) and/or the end effector 300 into a first position relative to a transfer plate 346 of the processing chamber 342. In particular, the controller may guide the end effector 300 a first distance into the first position within the processing chamber 342. The substrate 334 may be transferred to the transfer plate 346 using the robot under control of the controller. The substrate 334 is then processed in accordance with the methods and procedures previously described herein.

With reference to FIG. 6B, a second mode of operation will be described relative to moving the substrate 334 in a processed state. In particular, the second mode of operation will be described relative to moving the substrate 334 from the processing chamber 342 of the reactor 344 to the load lock with a robot (e.g., the robot 236 of FIG. 2) having the end effector 300. It will be appreciated, however, that the second mode of operation may also include moving the substrate 334 from the load lock to the pod with a robot (e.g., the robot 224 of FIG. 2) having the end effector 300.

As illustrated in FIG. 6B, subsequent to processing, the end effector 300 removes the substrate 334 from the processing chamber 342 of the reactor 344 in the second mode of operation. Specifically, the first, third, fourth, and seventh substrate support pads 312, 316, 318, 324, as the first, third, fourth, and seventh heights h1, h3, h4, h7, respectively, may engage the peripheral edge 336 of the substrate 334 to remove the substrate 334 from the processing chamber. Accordingly, when the first, third, fourth, and seventh substrate support pads 312, 316, 318, 324 engage the peripheral edge 336 of the substrate 334, the second substrate support pad 314 is disposed directly between the substrate 334 and the substrate-facing surface 308 of the end effector 300. In particular, the second substrate support pad 314 is disposed radially inward of the peripheral edge 336, and the fifth and sixth substrate support pads 320, 322 are disposed radially outward of the peripheral edge 336. In addition the central axis A3 of the substrate 334 may be aligned with the first axis A1 of the first circle 328 when the substrate 334 is removed from processing chamber 342. It will be appreciated that the substrate 334 may be dirty or otherwise in a processed condition upon being removed from the processing chamber 342, and while being engaged by the first, third, fourth, and seventh substrate support pads 312, 316, 318, 324.

In order to remove the substrate 334 from the processing chamber 342, the controller may guide the robot and/or the end effector 300 into a second position relative to the transfer plate 346 of the processing chamber 342. In particular, the controller may guide the end effector 300 a second distance into the second position within the processing chamber 342. A distance X2 between the first position of the first mode of operation and the second position of the second mode of operation is substantially equal to the distance X1 between the first and second axes A1, A2 (FIG. 5) of the first and second circles 328, 330. The substrate 334 may then be transferred to the end effector 300 using the robot under control of the controller.

As described above, the example method of handling the substrate 334 with the end effector 300 may include guiding the end effector 300 first and second distances into the first and second positions within the processing chamber 342 during the first and second modes of operation, respectively. It will be appreciated, however, that the method can also include moving the end effector 300 a first distance in each of the first and second modes of operation, and moving the substrate 334 the distance X2 during one of the first and second modes of operation. For example, after moving the substrate 334 into the processing chamber 340, and prior to removing the substrate from the processing chamber 342, the method may include moving the substrate 334 by the distance X2.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. An end effector comprising:
   a first substrate support pad defining a first height;
   a second substrate support pad defining a second height that is less than the first height;
   a third substrate support pad defining a third height that is greater than the second height;
   a fourth substrate support pad defining a fourth height that is less than the third height;
   a fifth substrate support pad defining a fifth height that is greater than the fourth height;
   a sixth substrate support pad defining a sixth height that is greater than the fourth height; and
   a seventh substrate support pad defining a seventh height that is less than the sixth height,
   wherein the first, third, fourth, and seventh substrate support pads define a first circle having a first diameter and a first central axis,
   wherein the second, fifth, and sixth substrate support pads define a second circle having a second diameter and a second central axis, and
   wherein the first diameter is equal to the second diameter and the first central axis is offset from the second central axis.

2. The end effector of claim 1, wherein the first and second central axes intersect and define an acute angle.

3. The end effector of claim 1, further comprising:
   a body portion; and
   first and second tine portions extending from the body portion,
   wherein the fourth and fifth substrate support pads are disposed on the first tine portion; and
   wherein the sixth and seventh substrate support pads are disposed on the second tine portion.

4. The end effector of claim 3, wherein the body portion is monolithically formed with the first and second tine portions.

5. A system comprising:
   the end effector of claim 1; and
   a controller configured to:
      at a first time, engage the first, third, fourth, and seventh substrate support pads with a peripheral edge of a substrate; and
      at a second time that is different than the first time, engage the second, fifth, and sixth substrate support pads with the peripheral edge of the substrate.

6. The system of claim 5 wherein:
   the substrate is unprocessed at the first time; and
   the substrate is processed at the second time.

7. The system of claim 5 wherein:
   the second, fifth, and sixth substrate support pads do not engage the peripheral edge of the substrate at the first time; and
   the first, third, fourth, and seventh substrate support pads do not engage the peripheral edge of the substrate at the second time.

\* \* \* \* \*